(12) United States Patent
Lee et al.

(10) Patent No.: US 8,283,852 B2
(45) Date of Patent: Oct. 9, 2012

(54) ORGANIC LIGHT EMITTING DEVICE

(75) Inventors: Sung-Soo Lee, Suwon-si (KR); Joo-Hyeon Lee, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 744 days.

(21) Appl. No.: 12/473,904

(22) Filed: May 28, 2009

(65) Prior Publication Data

US 2010/0123387 A1 May 20, 2010

(30) Foreign Application Priority Data

Nov. 20, 2008 (KR) .................. 10-2008-0115691

(51) Int. Cl.
*H01L 51/50* (2006.01)
(52) U.S. Cl. .................. 313/504; 313/512; 428/690
(58) Field of Classification Search ............... 73/861.12, 73/861.14, 861.08; 313/504, 512; 428/690
See application file for complete search history.

(56) References Cited

U.S. PATENT DOCUMENTS

| | | | |
|---|---|---|---|
| 6,555,421 B2 * | 4/2003 | Matsuyama et al. | 438/164 |
| 6,917,159 B2 | 7/2005 | Tyan et al. | |
| 2006/0083946 A1 * | 4/2006 | Lee et al. | 428/690 |
| 2008/0070033 A1 * | 3/2008 | Chen et al. | 428/336 |

FOREIGN PATENT DOCUMENTS

| | | |
|---|---|---|
| JP | 08-008061 | 1/1996 |
| JP | 2001-274158 | 10/2001 |
| JP | 1020060046476 A | 5/2006 |
| KR | 1020060084112 A | 7/2006 |
| KR | 1020070015085 A | 2/2007 |
| KR | 1020080011572 A | 2/2008 |

OTHER PUBLICATIONS

English Translation of KR 10-2006-0046476, published May 17, 2006.*

* cited by examiner

*Primary Examiner* — Nimeshkumar Patel
*Assistant Examiner* — Mary Ellen Bowman
(74) *Attorney, Agent, or Firm* — F. Chau & Associates, LLC

(57) ABSTRACT

An organic light emitting device includes: a substrate; thin film structures formed on the substrate; a pixel electrode including a metal layer formed on the thin film structures, and a transparent conductor layer formed on the metal layer; a common electrode facing the pixel electrode; and an organic light emitting member disposed between the pixel electrode and the common electrode, wherein the organic light emitting member includes an emission layer and a plurality of auxiliary layers, and the profile thickness of a first layer as at least one layer among the emission layer and the auxiliary layers on the substrate is different from the profile thickness of at least one second layer that is different from the first layer among the emission layer and the auxiliary layers.

18 Claims, 8 Drawing Sheets

ORGANIC LIGHT EMITTING DEVICE

CROSS-REFERENCE TO RELATED APPLICATION

This application claims priority to and the benefit of Korean Patent Application No. 10-2008-0115691 filed in the Korean Intellectual Property Office on Nov. 20, 2008, the entire contents of which are incorporated herein by reference.

BACKGROUND (a) Technical Field

The present disclosure relates to an organic light emitting device.

(b) Discussion of Related Art

An organic light emitting device includes a plurality Of pixels, and each pixel includes an organic light emitting element and a plurality of thin film transistors for driving them.

The organic light emitting element includes an anode and a cathode as two electrodes and an organic light emitting member as the emission layer disposed therebetween. The organic light emitting member emits light of three primary colors, such as red, green, and blue, or emits white light. Materials used vary according to the colors that the organic light emitting member emits, and a method of emitting white light, in which light emitting materials that emit red, green, and blue are stacked so that the synthesized light becomes white, is mainly used. Moreover, in the case where the organic light emitting member emits white light, a color filter is added to obtain light of a desired color.

Light emitted from the respective pixels may not have the desired optical characteristics, such as wavelength and color purity, however, due to material characteristics of the organic light emitting element or due to light interference by a thin film through which the light passes.

The above information disclosed in this Background section is only for enhancement of understanding of the background of the invention and, therefore, it may contain information that does not form the prior art that is already known in this country to a person of ordinary skill in the art.

SUMMARY OF THE INVENTION

Exemplary embodiments of the present invention improve the optical characteristics of the organic light emitting device.

An organic light emitting device according to an exemplary embodiment of the present invention includes: a substrate; thin film structures formed on the substrate; a pixel electrode including a metal layer formed on the thin film structures, and a transparent conductor layer formed on the metal layer; a common electrode facing the pixel electrode; and an organic light emitting member disposed between the pixel electrode and the common electrode, wherein the organic light emitting member includes an emission layer and a plurality of auxiliary layers, and the profile thickness of a first layer as at least one layer among the emission layer and the auxiliary layers on the substrate is different from the profile thickness of at least one second layer that is different from the first layer among the emission layer and the auxiliary layers.

The profile thickness of the first layer may be thinner from the central portion of the substrate to the edge of the substrate.

The profile thickness of the second layer may be thicker from the central portion of the substrate to the edge of the substrate.

The profile thickness of the first layer may compensate the thickness change of the second layer, such that the profile thickness of the first layer may be changed in a direction such that the profile thickness uniformity of the organic light emitting member substrate is improved.

The auxiliary layers may include an electron transport layer, a hole transport layer, an electron injection layer, and a hole injection layer.

The first layer may be the hole transport layer.

The profile thickness deviation of the hole transport layer may be less than 200 Å.

The first layer may be a hole transport layer as one of the plurality of auxiliary layers.

The emission layer may include a plurality of su-emission layers emitting light of different wavelengths from each other, and white light is emitted by the combination of the light of the different wavelengths.

The sub-emission layer may include a first sub-emission layer emitting a first color, a second sub-emission layer emitting a second color, and a third sub-emission layer emitting a third color, and the first sub-emission layer, the second sub-emission layer, and the third sub-emission layer are repeatedly deposited at least twice.

The organic light emitting device may further include a color filter formed between the thin film structures and the pixel electrode.

The pixel electrode may further include a metal oxide layer formed under the metal layer.

The transparent conductor layer and the metal oxide layer may include polycrystalline ITO or IZO.

The metal layer may include silver or aluminum.

According to exemplary embodiments of the present invention, the thickness of the organic light emitting member in the organic light emitting device is uniform, thereby improving the optical characteristics without a luminance deviation.

DETAILED DESCRIPTION OF EXEMPLARY EMBODIMENTS

Figure 1:
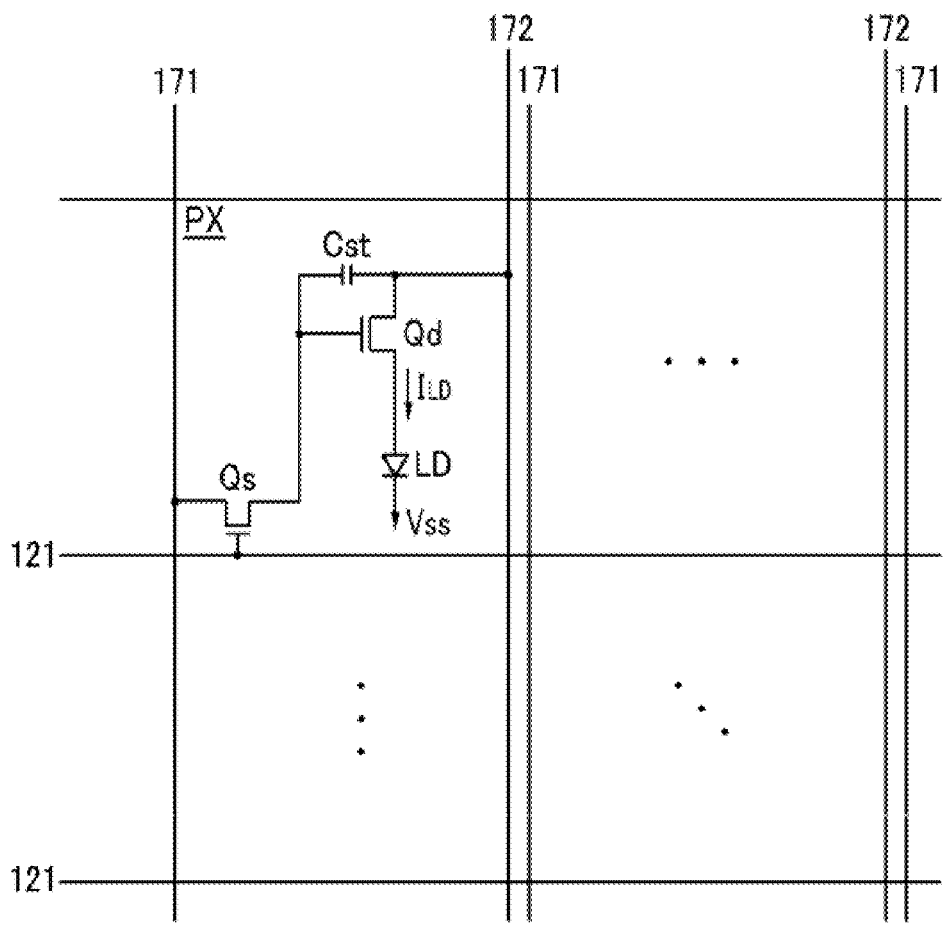
FIG. 1 is an equivalent circuit diagram of an organic light emitting device according to an exemplary embodiment of the present invention.

The present invention will be described more fully hereinafter with reference to the accompanying drawings, in which exemplary embodiments of the present invention are shown.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast when an element is referred to as being "directly on" another element, there are no intervening elements present.

Now, an OLED according to an exemplary embodiment of the present invention will be described in detail with reference to FIG. 1.

FIG. 1 is an equivalent circuit diagram of an organic light emitting device according to an exemplary embodiment of the present invention.

Referring to FIG. 1, an organic light emitting device according to the present exemplary embodiment includes a plurality of signal lines 121, 171, and 172, and a plurality of pixels PX connected thereto and arranged substantially in a matrix.

The signal lines include a plurality of scanning signal lines 121 for transmitting gate signals (or scanning signals), a plurality of data lines 171 for transmitting data signals, and a plurality of driving voltage lines 172 for transmitting a driving voltage. The scanning signal lines 121 extend substantially in a row direction and are substantially parallel to each other, and the data lines 171 extend substantially in a column direction and are substantially parallel to each other. Although the driving voltage lines 172 are shown as extending substantially in a column direction, the driving voltage lines 172 may extend in a row direction or in a column direction, or may be formed in a matrix.

Each pixel PX includes a switching transistor Qs, a driving transistor Qd, a storage capacitor Cst, and an organic light emitting element LD.

The switching transistor Qs includes a control terminal, an input terminal, and an output terminal, in which the control terminal is connected to the scanning signal line 121, the input terminal is connected to the data line 171, and the output terminal is connected to the driving transistor Qd. The switching transistor Qs transmits the data signal received from the data line 171 to the driving transistor Qd in response to the scanning signal received from the scanning signal line 121.

The driving transistor Qd also includes a control terminal, an input terminal, and an output terminal, in which the control terminal is connected to the switching transistor Qs, the input terminal is connected to the driving voltage line 172, and the output terminal is connected to the organic light emitting element LD. The driving transistor Qd applies an output current $I_{LD}$, the magnitude of which varies according to the voltage applied between the control terminal and the output terminal.

The capacitor Cst is connected between the control terminal and the input terminal of the driving transistor Qd. The capacitor Cst stores the data signal applied to the control terminal of the driving transistor Qd and maintains the stored data signal even after the switching transistor Qs is turned off.

The organic light emitting element LD is an organic light emitting diode (OLED), for example having an anode connected to the output terminal of the driving transistor Qd and a cathode connected to a common voltage Vss. The organic light emitting element LD emits light, the intensity of which is varied according to the output current ILD of the driving transistor Qd, IN ORDER to display an image.

The switching transistor Qs and the driving transistor Qd are n-channel field effect transistors (FET); however, at least one of the switching transistor Qs and the driving transistor Qd may be a p-channel FET. Moreover, the connection relationship among the transistors Qs and Qd, the storage capacitor Cst, and the organic light emitting element LD may be changed.

If necessary, other transistors for compensating the threshold voltage of the driving transistor Qd or the organic light emitting element LD may be included in addition to the switching transistor Qs and the driving transistor Qd.

Next, the detailed structure of the organic light emitting device LD shown in FIG. 1 will be described with reference to FIG. 2 as well as FIG. 1.

Figure 2:
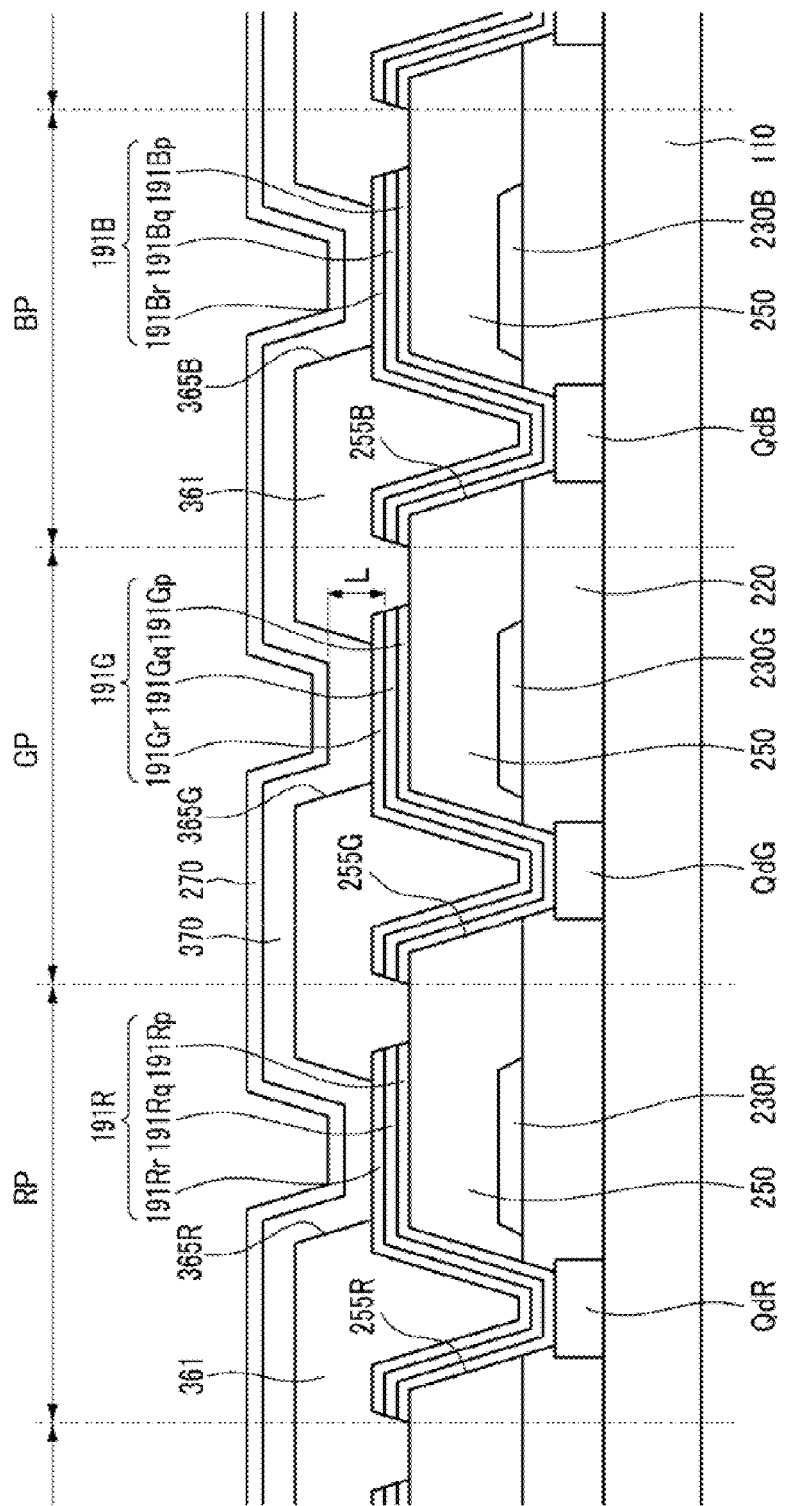
FIG. 2 is a cross-sectional view of an organic light emitting device according to an exemplary embodiment of the present invention.

FIG. 2 is a cross-sectional view of the organic light emitting device in accordance with an exemplary embodiment of the present invention.

The organic light emitting device in accordance with the present exemplary embodiment includes a red pixel RP, a green pixel GP, and a blue pixel BP. Pixels other than the three primary colors of red, green, and blue may also be included.

In FIG. 2, R, G, and B are added to the reference numerals related to the red pixel RP, the green pixel GP, and the blue pixel BP, respectively.

A plurality of driving transistors QdR, QdG, and QdB are formed on an insulation substrate 110 made of transparent glass or plastic. Moreover, thin film structures 220 including a switching transistor (not shown) are formed on the substrate 110. In the thin film structures 220, an insulating layer (not shown) for covering the driving transistors QdR, QdG, and QdB may be provided, and another thin film structure (not shown) may be formed below the driving transistors QdR, QdG, and QdB.

A red color filter 230R, a green color filter 230G, and a blue color filter 230B are formed on the thin film structure 220. A white pixel may be included as well as the red pixel RP, the green pixel GP, and the blue pixel BP, and a color filter for the white pixel is not required in this case.

An overcoat 250 is formed on the color filters 230R, 230G, and 230B and the thin film structures 220. The overcoat 250 may be made of an organic material and may have a flat surface. A plurality of through holes 255R, 255G, and 255B positioned on the driving transistors QdR, QdG, and QdB is formed on the overcoat 250 and the thin film structures 220.

A plurality of pixel electrodes 191R, 191G, and 191B is formed on the overcoat 250. Each of the pixel electrodes 191R, 191G, and 191B has a triple-layered structure including lower layers 191Rp, 191Gp, and 191Bp, middle layers 191Rq, 191Gq, and 191Bq and upper layers 191Rr, 191Gr, and 191Br, respectively. The pixel electrodes 191R, 191G, and 191B are connected to the driving transistors QdR, QdG, and QdB through the contact holes 255R, 255G, and 255B, respectively.

The lower layers 191Rp, 191Gp, and 191Bp may be made of a metal oxide, such as polycrystalline indium tin oxide (ITO) or indium zinc oxide (IZO). The lower layers 191Rp, 191Gp, and 191Bp protect the middle layers 191Rq, 191Gq, and 191Bq from oxygen or moisture that may flow from the overcoat 250 of the organic material.

The middle layers 191Rq, 191Gq, and 191Bq) may be made of a metal having a high reflectance, such as silver (Ag), a magnesium-silver (Mg:Ag) alloy, and aluminum (Al). Although the middle layers 191Rq, 191Gq, and 191Bq are made of metal, if the thickness is thin, the metal can have a transflective characteristic in which incident light is both reflected and transmitted.

The upper layers 191Rr, 191Gr, and 191Br may be made of a transparent conductor, such as polycrystalline ITO or IZO.

The lower layers 191Rp, 191Gp, and 191Bp, the middle layers 191Rq, 191Gq, and 191Bq, and the upper layers 191Rr, 191Cr, and 191Br have substantially the same plan shape, and accordingly the side surfaces are all exposed.

A partition 361 is formed on the pixel electrodes 191R, 191C, and 191B and the overcoat 250. The partition 361 has openings 365R, 365G, and 365B exposing the pixel electrodes 191R, 191G, and 191B of the red pixel RP, the blue pixel BP, and the green pixel GP, respectively.

A white organic light emitting member 370 is formed on the pixel electrodes 191R, 191G, and 191B and the partition 361, and a common electrode 270 transmitting a common voltage Vss is formed on the white organic light emitting member 370.

The white organic light emitting member 370 may have a structure in which a plurality of organic materials emitting different primary colors are deposited, and the common electrode 270 may be made of a reflective metal such as calcium (Ca), barium (Ba), magnesium (Mg), aluminum (Al), and silver (Ag).

In the organic light emitting device of the instant exemplary embodiment, the pixel electrodes 191R, 191G, and 191B, the white light emitting member 370, and the common electrode 270 form an organic light emitting diode LD having the pixel electrodes 191R, 191G, and 191B as anodes and the common electrode 270 as a cathode.

The organic light emitting device emits the light in the lower direction of the substrate 110 to display the images. The light emitted in the lower direction of the substrate 110 in the organic light emitting member 370 passes through the upper layers 191Rr, 191Gr, and 191Br of the pixel electrodes 191R, 191G, and 191B, and arrives at the middle layers 191Rq, 191Gq, and 191Bq. The middle layers 191Rq, 191Gq, and 191Bq reflect the incident light toward the common electrode 270, and the common electrode 270 again reflects the light toward the middle layers 191Rq, 191Gq, and 191Bq. Accordingly, the light reciprocating between the middle layers 191Rq, 191Gq, and 191Bq and the common electrode 270 is subjected to an optical process, such as constructive interference, and passes through the middle layers 191Rq, 191Gq, and 191Bq and the color filters 230R, 230G, and 230B to the outside when a predetermined condition is satisfied.

In this exemplary embodiment, the path of the light is varied according to the thickness and the refractive index of thin films between the middle layers 191Rq, 191Gq, and 191Bq, and the common electrode 270, such that light having desired optical characteristics, for example, a wavelength of a desired range and a desired color purity, may be enhanced by appropriately selecting the thickness and materials of the thin films.

Next, the white organic light emitting member of the organic light emitting device according to the present exemplary embodiment will be described with reference to FIG. 3 to FIG. 5.

Figure 3:
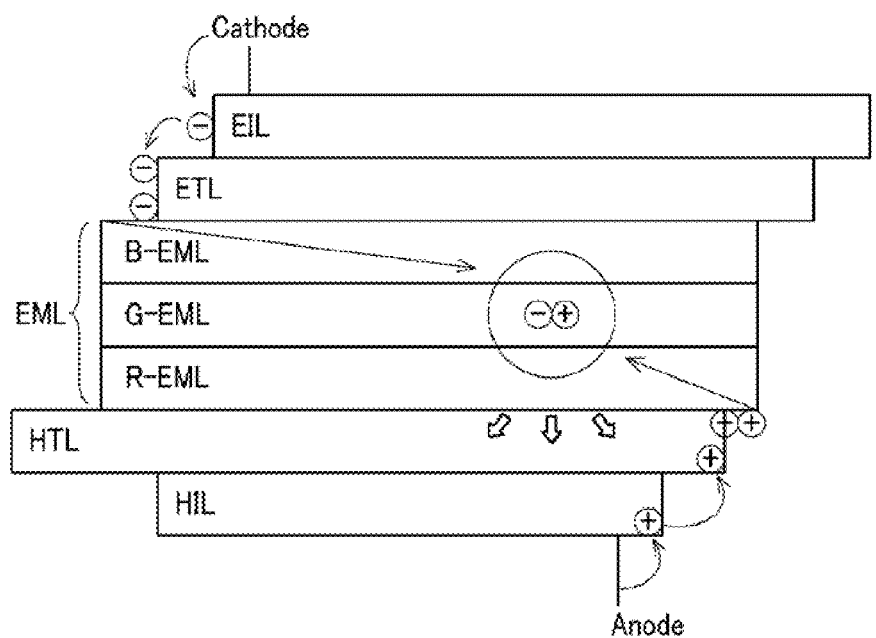
FIG. 3 is a schematic diagram of an organic light emitting member in an organic light emitting device according to an exemplary embodiment of the present invention.
Figure 4:
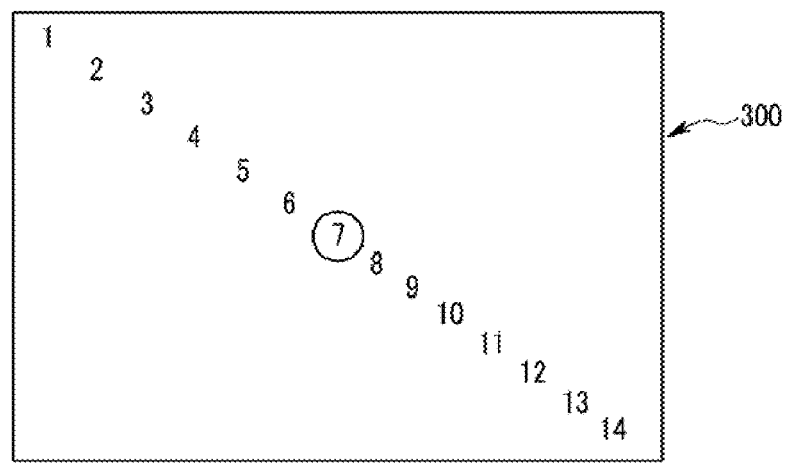
FIG. 4 is a view showing predetermined positions of a display panel of an organic light emitting device using numbers.
Figure 5:
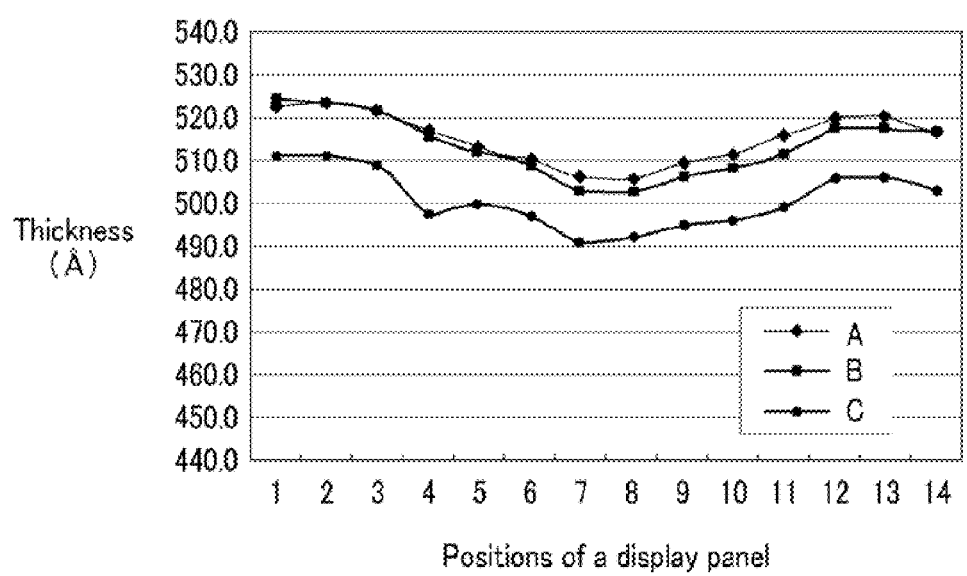
FIG. 5 is a graph showing thickness of an organic light emitting element according to the various positions of FIG. 4 in the organic light emitting device according to an exemplary embodiment of the present invention.

FIG. 3 is a schematic diagram of an organic light emitting member in an organic light emitting device according to an exemplary embodiment of the present invention, FIG. 4 is a view showing predetermined positions of a display panel of an organic light emitting device as numbers, and FIG. 5 is a graph showing a thickness of an organic light emitting element according to the positions of FIG. 4 in the organic light emitting device according to an exemplary embodiment of the present invention.

As shown in FIG. 3, the organic light emitting member 370 of FIG. 2 has a multi-layered structure including auxiliary layers for improving light emitting efficiency of an emitting layer EML in addition to that inherent in the emitting layer EML. The auxiliary layers include an electron transport layer ETL and a hole transport layer HTL for adjusting the balance of electrons and holes, and an electron injecting layer EIL and a hole injecting layer HIL for solidifying the injection of electrons and holes. The auxiliary layers may be omitted, if desired.

The emission layer EML may include a plurality of sub-emission layers, and the sub-emission layers include a red sub-emission layer R-EML, a green sub-emission layer G-EML, and a blue sub-emission layer B-EML that are sequentially deposited, thereby emitting a white light.

The sub-emission layers may be formed to be horizontal rather than being limited to being formed to be vertically formed, and various colors may be combined so long as they can manifest white light, without being limited to the red, green, and blue colors.

The emission layer 370 may have a structure in which the plurality of sub-emission layers are stacked repeatedly several times. That is, for example, the red sub-emission layer R-EML, the blue sub-emission layer G-EML, and the green sub-emission layer B-EML may be sequentially stacked, the auxiliary layers stacked, and then the red sub-emission layer R-EML, the blue sub-emission layer G-EML, and the green sub-emission layer B-EML may be stacked again.

As above-described, in the organic light emitting device according to an exemplary embodiment of the present invention, it is possible to obtain light having desired optical characteristics, such as wavelengths of a desired range and color purity, according to the thickness L and the refractive index of the thin films between the middle layers 191Rq, 191Gq, and 191Bq of the respective pixel electrodes 191R, 191G, and 191B, and the common electrode 270, that is, between the organic light emitting member 370 and the upper layers 191Rr, 191Gr, and 191Br. In this exemplary embodiment, the thickness L of the organic light emitting member 370 and upper layers 191Rr, 191Gr, and 191Br has a predetermined reference range for obtaining the wavelength and the color purity of the desired range per each color according to each pixel. If the thickness L of the organic light emitting member 370 and upper layers 191Rr, 191Gr, and 191Br does not satisfy the reference range, the wavelength and the color purity of the light are not provided such that a deviation of the produced light may be observed by the viewer.

In the general organic light emitting device, the upper layers 191Rr, 191Gr, and 191Br are uniformly deposited on the whole region, however, the emission layer EML and the auxiliary layers forming the organic light emitting member 370 may be non-uniformly deposited in the deposition process.

TABLE 1

| Kind of the pixels | Thickness deviation (Å) | X | Y | Luminance uniformity |
|---|---|---|---|---|
| Red pixel | 0 | 0.67 | 0.33 | 83.8 |
|  | −90 | 0.661 | 0.338 |  |
|  | +90 | 0.678 | 0.322 |  |

TABLE 1-continued

| Kind of the pixels | Thickness deviation (Å) | X | Y | Luminance uniformity |
|---|---|---|---|---|
| Green pixel | 0 | 0.21 | 0.713 | 85.8 |
|  | −90 | 0.172 | 0.725 |  |
|  | +90 | 0.248 | 0.689 |  |
| Blue pixel | 0 | 0.125 | 0.08 | 84.3 |
|  | −90 | 0.131 | 0.066 |  |
|  | +90 | 0.118 | 0.099 |  |

Table 1 is a table representing the color coordinates and the luminance uniformity when the thickness deviation per each pixel is ±90 Å. Referring to Table 1, each color coordinate is substantially changed when the thickness is thicker by 90° and is thinner by 90 Å compared with when the thickness deviation does not exist per each pixel. Also, assuming the luminance uniformity when the thickness deviation does not exist is 100, if the thickness deviation is generated by 90 Å, the respective luminance uniformity of the pixels are dropped to 83.8, 85.8, and 84.3. Accordingly, it is necessary to deposit the emission layer EML and the auxiliary layers forming the organic light emitting member 370 with respective uniform thicknesses.

Referring to FIG. 4, in the display panel 300 of the organic light emitting device, the predetermined positions are indicated by the numerals 1 to 14 in the direction of the upper left corner to the lower right corner. Referring to FIG. 5, in the central portion of the display panel 300, that is, in the portion represented by 7, the profile thickness of the organic light emitting member 370 is the thinnest, and the profile thickness of the organic light emitting member 370 becomes gradually thicker as the positions move closer to the edges of the display panel 300.

In the organic light emitting device according to an exemplary embodiment of the present invention, to prevent the variation of the profile thickness of the organic light emitting member 370 according to the positions on the display panel 300, the profile thickness of at least one of the emission layer EML and the auxiliary layers forming the organic light emitting member 370 is formed differently according to the positions on the display panel 300. This will be described in detail with reference to FIG. 6.

Figure 6:
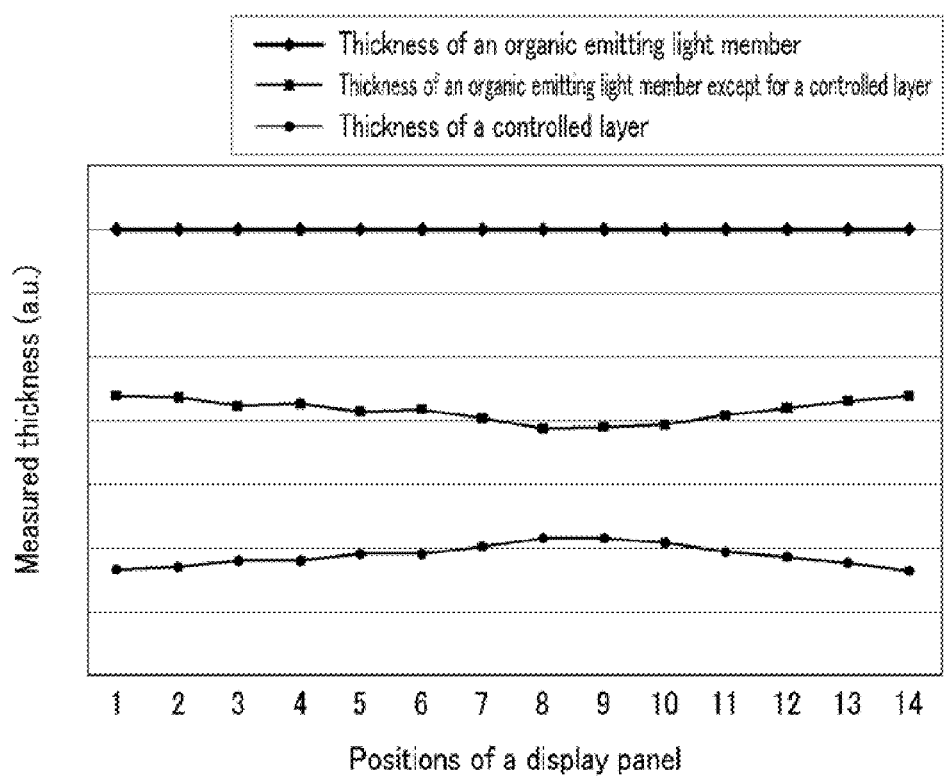
FIG. 6 is a view showing a profile thickness of an organic light emitting member in an organic light emitting device according to an exemplary embodiment of the present invention.

FIG. 6 is a graph showing a profile thickness of an organic light emitting member in an organic light emitting device according to an exemplary embodiment of the present invention.

Referring to FIG. 6, the thicknesses of the organic light emitting member 370 are shown according to the positions represented in FIG. 4 in the display panel of the organic light emitting device. At least one of the emission layer EML, the electron transport layer ETL, the hole transport layer HTL, the electron injecting layer EIL, and the hole injecting layer HIL consisting of the organic light emitting member 370 is determined, which is thereby referred to as a controlled layer, and if the profile thickness of the organic light emitting member 370 except for the controlled layer, is measured, the profile thickness become thinner closer to the central portion of the display panel, as shown in FIG. 6. In this exemplary embodiment, the profile thickness of the controlled layer is formed opposite to the profile thickness of the other layers of the organic light emitting member 370. That is, as shown in FIG. 6, the profile thickness of the controlled layer is thickest on the central portion of the display panel and is reduced as it moves closer to the edge. Thus, the overall organic light emitting element 370 has a uniform thickness on the whole display panel, as shown in FIG. 6.

In this exemplary embodiment, the controlled layer may include at least one of the emission layer EML and the auxiliary layers (ETL, HTL, EIL, HTL of FIG. 3) forming the organic light emitting member 370.

On the other hand, if the thickness of the controlled layer among the layers forming the organic light emitting member 370 is increased or decreased, the electrical characteristic of the controlled layer is changed such that it may be difficult to obtain the desired characteristics of the organic light emitting member 370. Like the hole transport HTL, however, if the mobility of the included carriers, such as holes or electrons, is fast enough, even though the thickness is controlled to some degree, the influence on the electrical characteristic is small.

This situation will be described in detail with reference to FIG. 7 and FIG. 8.

Figure 7:
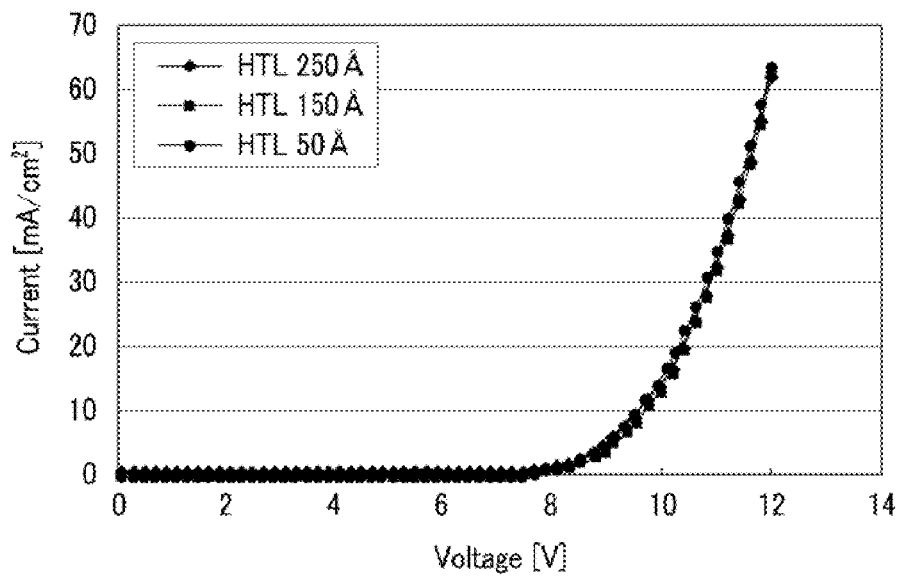
FIG. 7 is a graph showing current versus voltage when varying a profile thickness of a hole transport layer.
Figure 8:
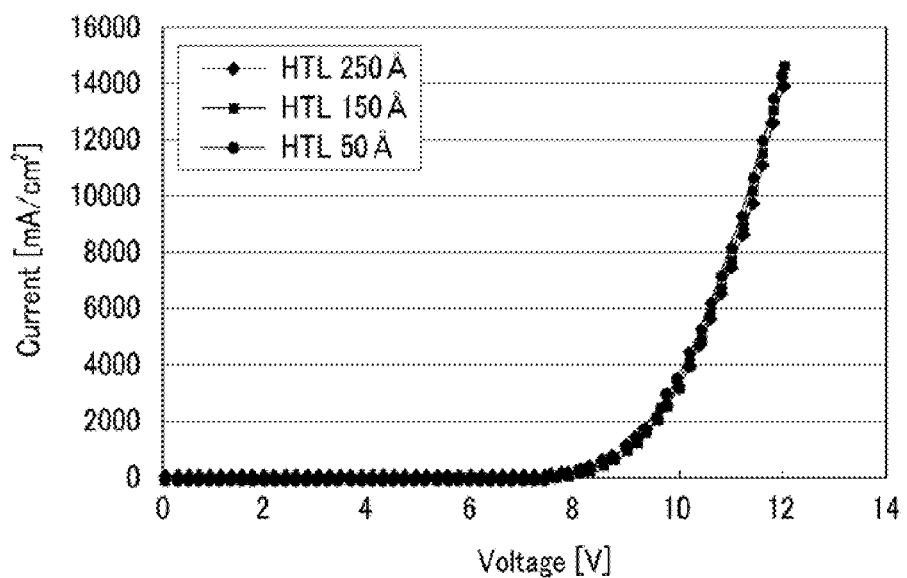
FIG. 8 is a graph showing luminance versus voltage when varying a profile thickness of a hole transport layer.

FIG. 7 is a graph showing current versus voltage when varying a profile thickness of a hole transport layer, and FIG. 8 is a graph showing luminance versus voltage when varying a profile thickness of a hole transport layer.

Referring to FIG. 7, if the current versus the voltage while changing the profile thickness of the hole transport layer HTL into 50 Å, 150 Å, and 250 Å is measured, the curved line shape of each of the three cases is little changed.

Referring to FIG. 8, if the luminance versus the voltage while changing the profile thickness of the hole transport layer HTL into 50 Å, 150 Å, and 250 Å is measured, the curved line shape of each of the three cases is also little changed.

That is, the change of the electric characteristic according to the profile thickness is small in the predetermined range for the hole transport layer HTL. Accordingly, it may be preferable that the controlled layer for controlling the profile thickness of the organic light emitting member 370 be selected to be the hole transport layer HTL.

Next, an organic light emitting device according to an exemplary embodiment of the present invention will be described with reference to FIG. 9 and FIG. 10.

Figure 9:
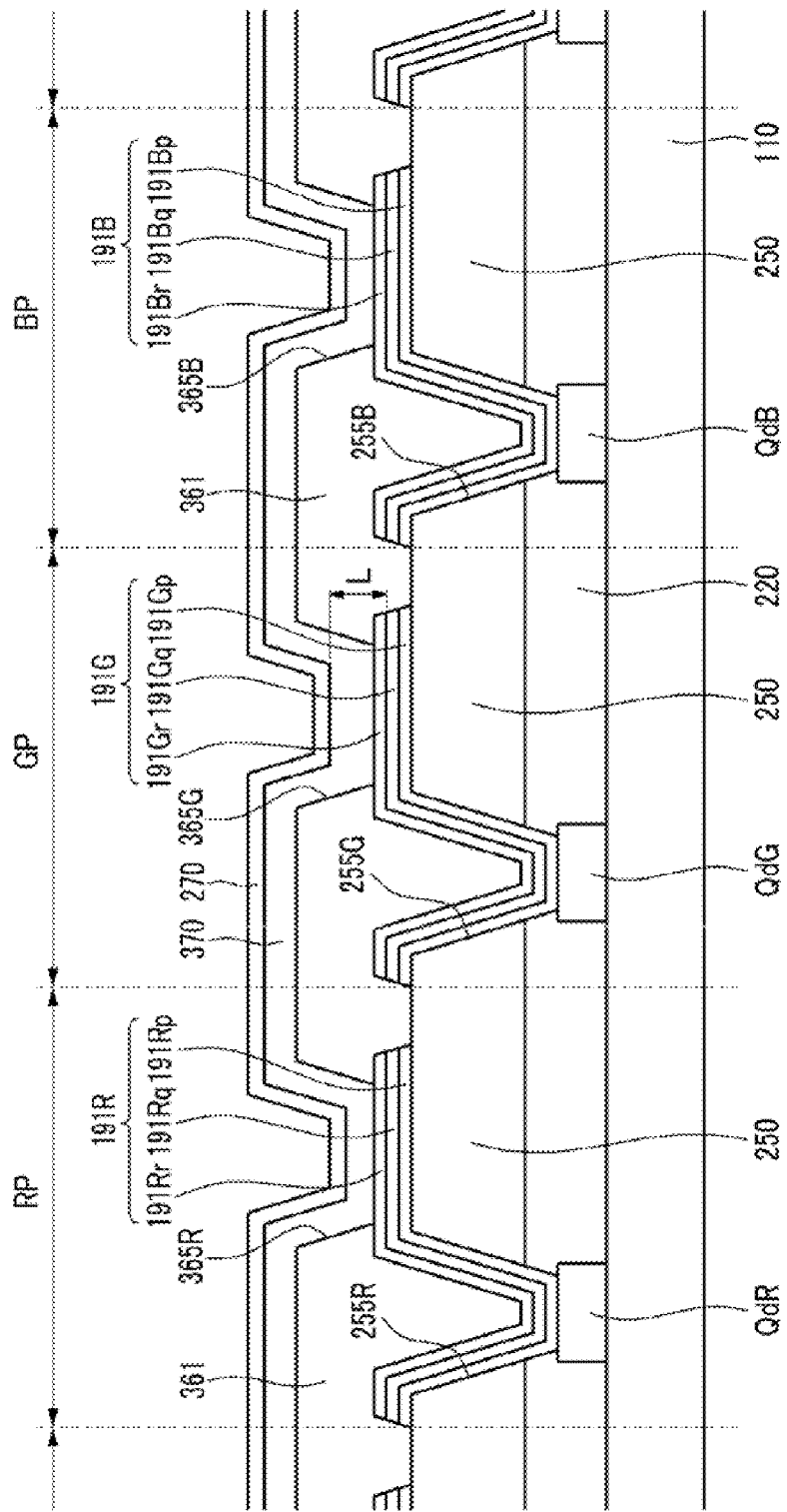
FIG. 9 is a cross-sectional view of an organic light emitting device according to an exemplary embodiment of the present invention.
Figure 10:
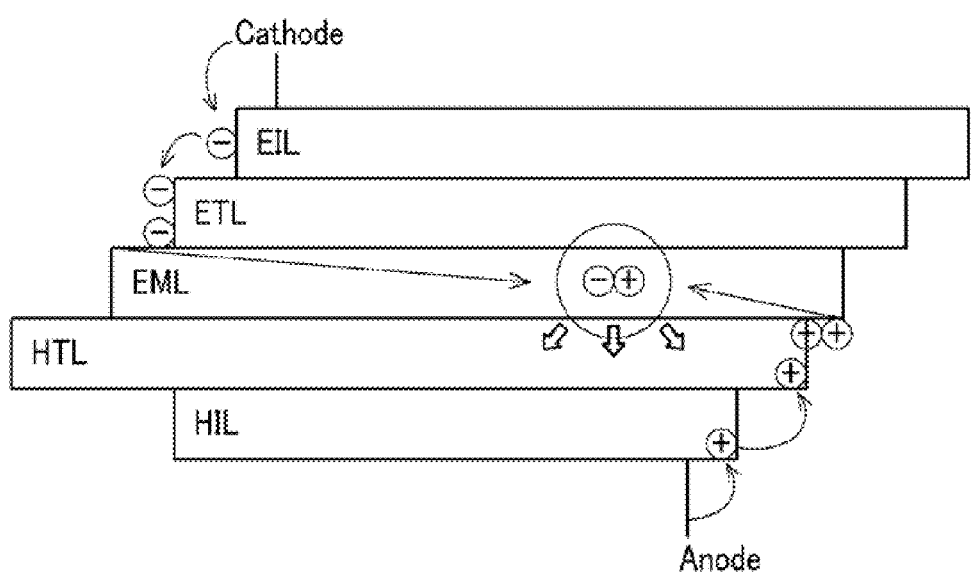
FIG. 10 is a view showing an organic light emitting member in the organic light emitting device shown in FIG. 9.

FIG. 9 is a cross-sectional view of an organic light emitting device according to an exemplary embodiment of the present invention, and FIG. 10 is a view showing an organic light emitting member in the organic light emitting device shown in FIG. 9.

Referring to FIG. 9 and FIG. 10, like the organic light emitting device shown in FIG. 2, an organic light emitting device according to the present exemplary embodiment includes a red pixel RP, a green pixel GP, and a blue pixel BP, and further includes a respective plurality of driving transistors QdR, QdG, and QdB formed on an insulation substrate 110, thin film structures 220, an overcoat 250 including through holes 255R, 255G, and 255B, pixel electrodes 191R, 191G, and 191B, a partition 361 having openings 365R, 365G, and 365B, and an organic light emitting member 370.

Unlike the organic light emitting device shown in FIG. 2, the organic light emitting device of FIG. 9 and FIG. 10 does not include the color filter, and the pixels RP, GP, and BP respectively include the organic light emitting member 370 having a different respective emission layer EML instead of the color filters. That is, the pixels RP, GP, and BP respectively include the red emission layer, the blue emission layer, and the green emission layer, thereby displaying the respective desired colors. These emission layers may be deposited per each pixel through a fine shadow mask or with Inkjet printing.

Like the organic light emitting device shown in FIG. 2 and FIG. 3, in the organic light emitting device shown in FIG. 9 and FIG. 10, the profile thickness of at least one layer among the layers forming the organic light emitting element 370 is property controlled, so that the total profile thickness of the organic light emitting element 370 is uniformly maintained.

While the present invention has been described in connection with what is presently considered to be practical exemplary embodiments, it is to be understood that the invention is not limited to the disclosed exemplary embodiments, but, on the contrary, is intended to cover various modifications and equivalent arrangements included within the spirit and scope of the appended claims.

What is claimed is:

1. An organic light emitting device comprising:
   a substrate;
   thin film structures formed on the substrate;
   a pixel electrode comprising a metal layer formed on the thin film structures, and a transparent conductor layer formed on the metal layer;
   a common electrode facing the pixel electrode; and
   an organic light emitting member disposed between the pixel electrode and the common electrode,
   wherein the organic light emitting member comprises an emission layer and a plurality of auxiliary layers, and a profile thickness of at least a first layer among the emission layer and the auxiliary layers on the substrate is different from a profile thickness of at least a second layer that is different from the first layer among the emission layer and the auxiliary layers,
   wherein the profile thickness of the second layer is thicker from a central portion of the substrate to an edge of the substrate.

2. The organic light emitting device of claim 1, wherein the profile thickness of the first layer is thinner from the central portion of the substrate to the edge of the substrate.

3. The organic light emitting device of claim 1, wherein the profile thickness of the first layer compensates a thickness change of the second layer such that the profile thickness of the first layer is changed in a direction such that a profile thickness uniformity of the organic light emitting member is improved.

4. The organic light emitting device of claim 1, wherein the auxiliary layers comprise an electron transport layer, a hole transport layer, an electron injection layer, and a hole injection layer.

5. The organic light emitting device of claim 4, wherein the first layer is the hole transport layer.

6. The organic light emitting device of claim 5, wherein a profile thickness deviation of the hole transport layer is less than about 200 Å.

7. The organic light emitting device of claim 1, wherein the first layer is a hole transport layer forming one of the plurality of auxiliary layers.

8. The organic light emitting device of claim 1, wherein the emission layer comprises a plurality of sub-emission layers emitting light of different wavelengths from each other, and emitting white light by combination of the light of the different wavelengths.

9. The organic light emitting device of claim 8, wherein the plurality of sub-emission layers comprises a first sub-emission layer emitting a first color, a second sub-emission layer emitting a second color, and a third sub-emission layer emitting a third color, wherein the first sub-emission layer, the second sub-emission layer, and the third sub-emission layer are repeatedly deposited at least twice.

10. The organic light emitting device of claim 1, further comprising a color filter formed between the thin film structures and the pixel electrode.

11. The organic light emitting device of claim 1, wherein the pixel electrode further comprises a metal oxide layer formed under the metal layer.

12. The organic light emitting device of claim 11, wherein the transparent conductor layer and the metal oxide layer comprise one of polycrystalline ITO and polycrystalline IZO.

13. The organic light emitting device of claim 1, wherein the metal layer comprises one of silver and aluminum.

14. An organic light emitting device comprising:
    a substrate;
    thin film structures formed on the substrate;
    a pixel electrode comprising a metal layer formed on the thin film structures, and a transparent conductor layer formed on the metal layer;
    a common electrode facing the pixel electrode; and
    an organic light emitting member disposed between the pixel electrode and the common electrode,
    wherein the organic light emitting member comprises an emission layer and a plurality of auxiliary layers, and a profile thickness of a first layer as at least one layer among the emission layer and the auxiliary layers on the substrate is different from a profile thickness of at least one second layer that is different from the first layer among the emission layer and the auxiliary layers,
    wherein the emission layer comprises a first sub-emission layer emitting a first color, a second sub-emission layer emitting a second color, and a third sub-emission layer emitting a third color, wherein the first sub-emission layer, the second sub-emission layer, and the third sub-emission layer are repeatedly deposited at least twice,
    wherein the profile thickness of the second layer is thicker from a central portion of the substrate to an edge of the substrate.

15. The organic light emitting device of claim 14, wherein the profile thickness of the first layer is thinner from the central portion of the substrate to the edge of the substrate.

16. The organic light emitting device of claim 14, wherein the profile thickness of the first layer compensates a thickness change of the second layer such that the profile thickness of the first layer is changed in a direction such that a profile thickness uniformity of the organic light emitting member is improved.

17. The organic light emitting device of claim 14, wherein the auxiliary layers comprise an electron transport layer, a hole transport layer, an electron injection layer, and a hole injection layer.

18. The organic light emitting device of claim 17, wherein the first layer is the hole transport layer.

* * * * *